Figure 1:
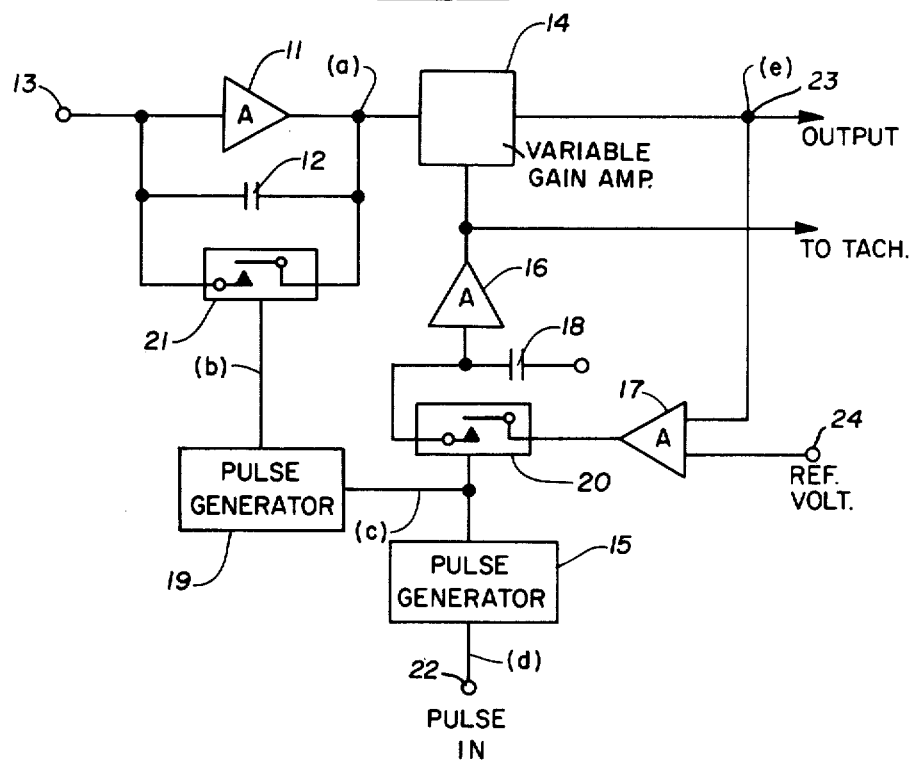

United States Patent [19]

Spalding

[11] 4,002,992

[45] Jan. 11, 1977

[54] AMPLITUDE CONTROL FOR SAWTOOTH WAVE FORM

[75] Inventor: David I. Spalding, Epping, Australia

[73] Assignee: Applied Power Australia Limited, Canberra City, Australia

[22] Filed: Sept. 22, 1975

[21] Appl. No.: 616,165

[52] U.S. Cl. .................... 328/181; 307/235 B; 307/235 T; 307/228; 328/127; 328/151; 328/185
[51] Int. Cl.² ............................................ H03K 4/10
[58] Field of Search .......... 307/228, 235 B, 235 T, 307/264; 328/127, 181–185, 151, 173, 175, 35

[56] References Cited
UNITED STATES PATENTS

| | | | |
|---|---|---|---|
| 3,314,407 | 4/1967 | Schneider | 307/228 |
| 3,373,377 | 3/1968 | Townsend | 307/228 |
| 3,571,617 | 3/1971 | Hainz | 328/185 |
| 3,577,007 | 5/1971 | Cross | 328/185 |
| 3,650,149 | 3/1972 | Howes | 324/165 |
| 3,769,598 | 10/1973 | Schauffele et al. | 328/185 |
| 3,808,460 | 4/1974 | Mosca | 328/35 |

Primary Examiner—Stanley D. Miller, Jr.
Attorney, Agent, or Firm—Frederick E. Lange

[57] ABSTRACT

A sawtooth wave form generating circuit in which the amplitude of the sawtooth wave form is automatically maintained at a constant value by passing the same through a variable gain amplifier, measuring the amplitude of the sawtooth wave form at the moment when it reaches its maximum value, comparing such amplitude with that of a standard voltage and adjusting the gain of the amplifier accordingly. This is done through the use of a capacitor which is charged upon the occurrence of the same pulse which discharges the capacitor of the sawtooth wave generator. The capacitor controlling the gain of the amplifier is charged under the control of a comparator amplifier having one input from the output of the variable gain amplifier and the other from a source of standard voltage. The sawtooth wave generator is particularly applicable for use in measuring phase differences between two events recurring at a variable repetition rate such as encountered in automobile ignition diagnosis.

5 Claims, 2 Drawing Figures

AMPLITUDE CONTROL FOR SAWTOOTH WAVE FORM

This invention relates to method and means for maintaining the amplitude of a sawtooth wave form substantially constant despite a variable repetition rate.

Many applications will be found for incorporation of the principles of the invention, for example for oscilloscope deflection with constant sweep width or for an automobile ignition advance and retard indicator using a stroboscopic timing light. In order to achieve either of the above functions by the invention, an electrical circuit is included in an automotive engine analyzer to generate a pulse train made synchronous with a convenient event in the engine firing cycle prior to the firing of a reference, or the "number one," cylinder. By the use of such a circuit the analyzer may serve to either advance or retard the firing cycle, or to measure the degree of advancement or retardation at which the engine is operating.

The present invention is concerned with the fact that in a sawtooth wave form having a linearly rising ramp voltage and peak voltages of uniform value, regardless of varying frequency thereof, the phase difference, as opposed to difference in time, between the occurrence of two events can in all periods of the generated sawtooth be represented by the same voltage difference.

Such a sawtooth wave form is customarily generated by charging a capacitor at a uniform rate until a signal responsive to an event being measured is effective to cause the capacitor to be rapidly discharged. Under these conditions, the voltage across the capacitor has a sawtooth wave form. In prior applications, the control of the amplituide of such a sawtooth wave form has been accomplished by measuring the difference between the maximum amplitude of the sawtooth wave form and a reference voltage and adjusting the charging rate of the capacitor until the amplitude of the sawtooth wave voltage has a predetermined relationship with respect to the reference voltage. Such a method of adjustment necessarily introduces some delay because variations in amplitude do not directly affect the amplitude but rather control the rate of charging of the capacitor.

In one general form the invention provides such a sawtooth wave form, adjusting the gain of the amplifier to insure peak voltages throughout the wave form of substantially uniform value, and causing said electrical control signal to be repeatedly generated every time the sawtooth wave form attains a predetermined voltage level.

The invention also provides apparatus for producing a sawtooth wave form of substantially uniform peak voltages with interconnecting linear ramps and of variable frequency in response to recurring electrical signals of variable spacing, characterized in that a ramp voltage generator is provided connected through a linear multiplier to an output, the amplification of said multiplier being automatically adjustable to maintain uniform output voltage, a resetting device for said ramp voltage generator responding to application of said recurring electrical signals, and a switching device for connecting a comparator to control adjustment of amplification of said linear multiplier upon application of said recurring electrical signals, whereby a sawtooth voltage wave form is derived at said output.

Figure 2:
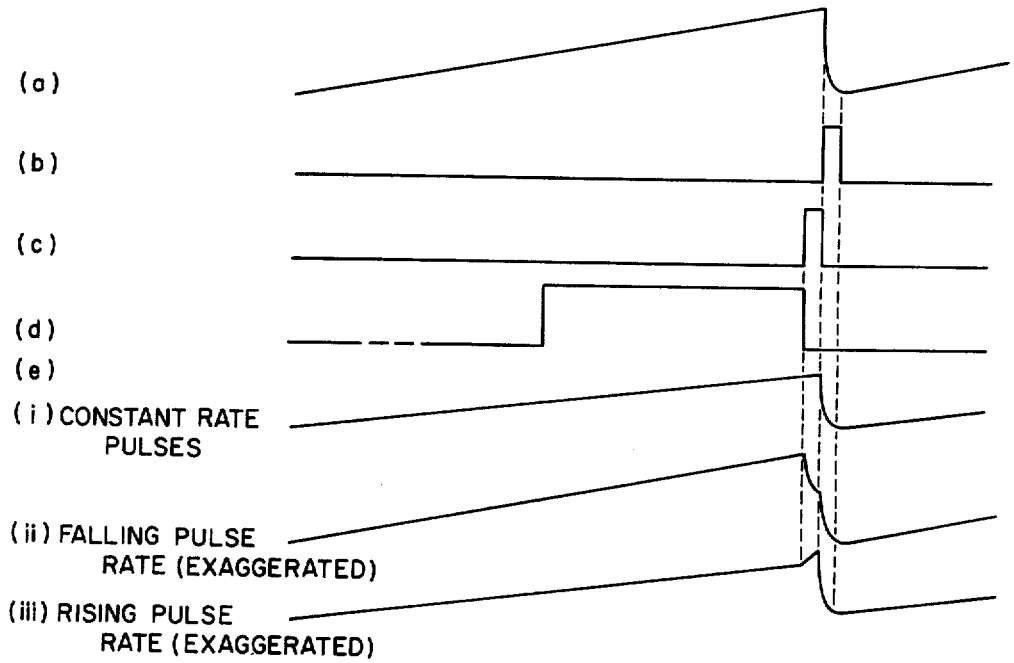

The invention will be described in greater detail with reference to the accompanying drawings in which:

FIG. 1 is a block diagram of an electrical circuit for producing a sawtooth voltage wave form characteristic of this invention; and FIG. 2 shows in timing diagram form the type of electrical signals to be expected at specified parts of the circuit of FIG. 1.

The circuit provided by this invention is suitable for use as a phase-reference generator in systems where it is necessary to establish a phase relationship of events occurring between successive pulses of a periodic train of variable repetition rate. From the following description it will be appreciated that the sawtooth amplitude error is proportional to the rate of variation of the pulse repetition rate and is corrected virtually to zero at the arrival of each new pulse in the train. A notable feature will be the high degree of linearity achieved which permits simple arithmetical processing of the wave form to obtain, for example, multiplication of the sawtooth repetition rate with accurate amplitude restoration by digital programming so that only ignition wave forms for each cylinder of an engine may be displayed one above the other on an oscilloscope screen, rather than successively in one line without changing the synchronization source for the sawtooth generator. Accuracy of phasing may thus be preserved throughout a complete cycle, therefore aiding in ignition fault diagnoses.

For purposes of illustration, therefore, it will be assumed that the circuit of the invention is used as a reference for ignition timing which will enable spark retardation to be measured conveniently and the ignition wave forms occurring at the time when each plug fires may be made to appear clearly near the center of the oscilloscope screen, instead of being lost during the retrace period as would be the case if the oscilloscope actually were synchronized to the spark plug firing impulses.

With reference to FIGS. 1 and 2 it will be seen that an integrator formed by an amplifier 11 connected across, capacitor 12 and to a current source 13 generates a linear ramp voltage which is fed to an output labelled OUTPUT through a linear multiplier 14 acting as a variable gain amplifier. A pulse generator 15 is connected to an input terminal 22 labelled "PULSE IN". The output terminal of the pulse generator is connected to a switch 20 to control the operation of the same. The switch 20 is connected between the output terminal of a comparator amplifier 17 and a storage capacitor 18. The capacitor 18 is connected through a buffer amplifier 16 to the gain control terminal of variable gain amplifier 14. The output of the amplifier 14 is not only connected to the output terminal 23 but also to one of the two input terminals of comparator amplifier 17. The other input terminal of comparator amplifier 17 is connected to an input terminal 24 connected to a reference voltage identified by the legend "REF. VOLT". The output of pulse generator 15 is connected to the input of pulse generator 19 to generate a further pulse. The output of pulse generator 19 is connected to a switch 21 to control the operation of the same. The switch 21 is connected across capacitor 12 to short circuit the same when switch 21 is closed.

When a pulse is applied at the input of the pulse generator 15, switch 20 is closed during the pulse so that the variable gain amplifier 14, the buffer amplifier 16, and the comparator amplifier 17 temporarily form a complete feedback loop acting in such a manner as to reduce the difference between the sawtooth output and an arbitrary reference voltage to zero. At the end of the sample pulse the voltage required to maintain the amplifier 14 at this gain is stored by capacitor 18 and a short reset pulse is generated by a pulse generator 19 to restore the integrator output to zero by short-circuiting capacitor 12. At the end of the reset pulse the whole cycle is repeated. The output is stablized after the first complete cycle. In the application described, the input pulse is derived from the ignition circuit by suitable logic circuits from the average time of initiation of the primary current build-up in the igntition coil prior to the firing of the "number one" cylinder spark plug. Wave form (a) is the wave form of the sawtooth wave form voltage generated by the circuit consisting of amplifier 11, capacitor 12 and switch 21. The wave form (b) indicates the output pulse produced by pulse generator 19 which is employed to operate the switch 21 to close the same. Since the closure of switch 21 short circuits capacitor 12, it will be noted that the output of the sawtooth wave form starts dropping immediately upon the initiation of pulse (b). The pulse (c) is the pulse produced by pulse generator 15 and which controls switch 20 and also pulse generator 19. It will be noted that pulse (b) is initiated immediately upon termination of pulse (c). The wave form (d) is a square wave which is the wave form of the input voltage pulse appearing at the terminal 22. As indicated above, this input pulse is derived from the ignition circuit by suitable logic circuits from the average time of initiation of the primary current build-up in the ignition coil prior to the firing of the "number one" cylinder spark plug. The pulse (c) is initiated immediately upon the termination of the square wave pulse (d). There are three wave forms (e), these wave forms representing the voltage appearing at the output of variable gain amplifier 14 and which is supplied to the "OUTPUT" of the circuit. The first of these is wave form (i) which is the wave form which exists when the frequency of the input pulse is constant. This wave form (i) is simply an amplified version of wave form (a). In the case of wave form (ii), the rate of repetition of the input pulse is falling. This means that there would be a longer time between pulses so that the maximum output would tend to rise since the capacitor 12 would have a longer time to charge. However, it will be noted that at an intermediate point, as a result of the effect of the apparatus, the output is changed. Wave form (iii) shows the condition that exists with a rising pulse rate. Here, the gain of the amplifier is increased to compensate for the shorter time the capacitor 12 has to charge. As indicated by the legends, the changes occurring in wave forms (ii) and (iii) are both exaggerated.

Amplifiers 11, 14, 16 and 17 can be suitable low cost integrated circuits.

Referring to FIG. 2, the numerals (a), (b), (c), (d), and (e) designate the wave forms at the various points in the circuit of FIG. 1 at which the corresponding letters appear.

A sawtooth wave form of this nature may be utilized for a number of purposes where an accurate phase displacement between two events capable of being expressed in electrical signals is to be determined. In every instance, and regardless of the period of the generated sawtooth and therefore the recurrence rate of the function it reads, different phase angles correspond to respective differential voltages.

While I have shown a specific embodiment of my invention, it is to be understood that this is for purposes of illustration only and that the scope of the invention is limited solely by the appended claims.

I claim:

1. A sawtooth voltage wave form generating circuit having:
    a capacitor,
    a charging circuit connected to said capacitor for charging the same,
    switching means also connected to said capacitor for discharing the same,
    an input terminal for connection to a source of pulses of variable repetition rate,
    means connected to said input terminal and operatively connected to said switching means and operable each time that one of said pulses is applied to said input terminal to cause said switching means to discharge said capacitor,
    an output terminal for said circuit,
    a variable gain amplifier connected between said capacitor and said output terminal for variably amplifying the voltage across said capacitor and applying the same to said output terminal,
    voltage responsive means connected to said output terminal for determining the magnitude of the voltage at said output terminal,
    means connected to said variable gain amplifier for controlling the gain thereof,
    and means connected to said voltage responsive means and said gain controlling means and effective each time that a pulse is received at said input terminal to cause said voltage responsive means to adjust said gain controlling means if the output voltage at the time of occurrence of the pulse does not have a predetermined value.

2. The sawtooth voltage wave form generating circuit of claim 1 in which the means for controlling the gain of the variable gain amplifier is a capacitor, the charge on which is varied each time that a pulse is received if the output voltage does not at that time have the desired value.

3. The sawtooth voltage wave form generating circuit of claim 1 in which the voltage comparing means compares the magnitude of the voltage at the output terminal to a reference voltage and in which the means for adjusting the gain controlling means is effective to adjust the same at the time of occurrence of the pulse if the output voltage at that time does not have the desired relationship to the reference voltage.

4. The sawtooth voltage wave form generating circuit of claim 3 in which the voltage comparing means is a comparator amplifier having two input terminals, one of which is connected to the source of reference voltage and the other of which is connected to the output terminal.

5. The sawtooth voltage wave form generating circuit of claim 4 in which the means for adjusting the gain controlling means includes a switch interposed between the comparator amplifier and the gain controlling means.

* * * * *

UNITED STATES PATENT OFFICE
CERTIFICATE OF CORRECTION

PATENT NO. : 4,002,992
DATED : January 11, 1977
INVENTOR(S) : David I. Spalding

It is certified that error appears in the above-identified patent and that said Letters Patent are hereby corrected as shown below:

Lines 56 through 61 of column 3 should appear following the words "spark plug." in line 14 of column 3, the language "Amplifiers 11, 14, . . . circuits." immediately following the words "spark plug." in line 14 as part of the same paragraph.

Signed and Sealed this

Seventeenth Day of January 1978

[SEAL]

Attest:

RUTH C. MASON
Attesting Officer

LUTRELLE F. PARKER
Acting Commissioner of Patents and Trademarks